United States Patent [19]

Chen et al.

[11] Patent Number: 4,661,801
[45] Date of Patent: Apr. 28, 1987

[54] DECODER FOR THREE LEVEL CODED DATA

[75] Inventors: Young K. Chen, Syracuse; David C. Dening, Chittenango; Christopher E. Marchant, Baldwinsville; Salvatore F. Nati, Jr., Syracuse, all of N.Y.

[73] Assignee: General Electric Company, Syracuse, N.Y.

[21] Appl. No.: 718,114

[22] Filed: Apr. 1, 1985

[51] Int. Cl.[4] ............................................. H03M 5/16
[52] U.S. Cl. ............................... 340/347 DD; 371/56; 375/20
[58] Field of Search .................. 340/347 DD; 375/20; 371/56; 332/11 D

[56] References Cited

U.S. PATENT DOCUMENTS

4,097,859 6/1978 Looschen ..................... 340/347 DD
4,442,528 4/1984 Fukuda ......................... 340/347 DD

*Primary Examiner*—T. J. Sloyan
*Attorney, Agent, or Firm*—Richard V. Lang; Carl W. Baker; Fred Jacob

[57] ABSTRACT

The decoder herein described recovers the clocking and the data in a binary format from a three level coded signal. The decoder has application to data rates in excess of one half gigabits per second, which are common to optical communication channels. The decoder employs a comparator for evaluating to two bit accuracy each state of the signal, a two stage, two bit per stage shift register, and decision logic for recovering the data in a binary format. The decoder is monolithically integrated using buffered FET logic on a gallium arsenide substrate. In the decoder, the comparator is optimized by the use of three zero crossing detectors, one of which has a zero input for reference purposes, in combination with two internal voltage dividers and two external voltage references for achieving an accurate drift free determination of the levels of the three level code (TLC) signal. The clock recovery means is optimized for high speed operation by the use, in association with each transition level, of a time delay and an exclusive OR-gate, the logical design of the exclusive OR-gate entailing a four NOR-gate configuration in which the timing indication resulting from each TLC transition is propagated through a like number of states and thereby experiences the same overall propagation delay, in reaching the decoder output.

12 Claims, 4 Drawing Figures

DECODER FOR THREE LEVEL CODED DATA

BACKGROUND OF THE INVENTION

1. Field of the Invention

The invention relates to digital apparatus capable of operating at bit rates in excess of one-half gigabits per second and in particular to apparatus for converting a three level coded signal transmitted at these high bit rates to a conventional binary format.

2. Description of the Prior Art

In high speed data communications, coherent optical paths have been proposed having data transmission rates from a half to tens of gigabits per second. An implementation problem posed by such optical communication channels is that of recovering the data and the clocking, usually as a preliminary to distributing the data to a number of individual channels of lower bandwidth. Such a system is described in U.S. application Ser. No. 688,375, filed Jan. 2, 1985, and entitled MONOLITHICALLY INTEGRATED ELECTRO-OPTICAL MULTIPLEXER/DEMULTIPLEXER (Messrs Fitelson, Wanuga and Williams).

It has been proposed that the optical signal in such channels be self clocking by resort to three level coding. In three level coding, a transition occurs at each clocking interval allowing recovery of the clocking directly by sensing the transitions. The data may be decoded, when a three level coded data stream is employed, to obtain a bit of data in binary format for each clocking interval.

At the high bit rates herein contemplated, monolithically integrated circuit fabrication is essential in view of the great speed required of individual active devices making up the decoder logic and in view of the need for interconnections between logic cells, which can efficiently carry signals at these high frequencies. The logic design, the circuit design of the logic, and the design of individual semiconductor devices within the circuitry must all be compatible with high speed operation. In particular, the maintenance of rigorous timing accuracy throughout all elements of the decoder and through the full variety of operations required of the decoder has presented a challenge to the designer.

SUMMARY OF THE INVENTION

Accordingly, it is an object of the invention to provide improved means for converting a three level coded data stream to binary data, clocked by clocking recovered from the data stream.

It is still another object of the invention to provide an improved decoder for converting three level coded data to binary data at high data rates.

It is still another object of the invention to provide a decoder for converting three level coded data to binary data suitable for monolithically integrated assembly.

It is a further object of the invention to provide a decoder for three level coded data having improved timing accuracy.

It is another object of the invention to provide a decoder for three level coded data having improved data handling accuracy.

These and other objects of the invention, are achieved in a decoder comprising comparison means for determining the value in two binary bits of each state of the TLC data stream; and means for converting the two bit binary values to serial binary data, the latter means in turn comprising means for storing two bit binary values received during two successive clocking intervals, and decision logic responding to two bit binary values for these two clocking intervals to obtain a bit of binary data for the later clocking interval and by repetition obtaining a bit of binary data for each clocking interval.

The decoder also includes means coupled to the comparison means for recovering the clocking from the TLC data stream. The clock recovery means comprises first means for producing an output upon a change in state of the higher of two bits and second means for producing an output upon a change in state of the lower of two bits, and means responsive to these latter outputs for producing an output pulse for each clocking interval. Each means responsive to a change in state comprises a delay and a two input exclusive OR-gate. The output of one comparison means is applied undelayed to one exclusive OR-gate input and delayed to the other exclusive OR-gate input.

In accordance with a further aspect of the invention, the time delays and the exclusive OR-gates are of like design, the latter being constituted of four NOR-gates each with known propagation delays in a configuration in which transitions of either polarity and coupled to either or both exclusvie OR-gates, produce an output clocking pulse whose starting transient requires the same number of propagation delays after a change in state in the TLC code. In a practical embodiment, the output pulse for a double level transition in the TLC data stream is of greater length than for a single level transition. In all cases the starting transient of the output pulse provides an accurate clocking guide. The two bit comparator output data is stored in a two stage, two bit per stage shift register, which employs polarity selective edge triggered flip-flops which respond to the starting transient of the output clocking pulse. Thus, the stored data is accurately clocked to the decision logic and appears with like accuracy at the output of the decoder.

In accordance with a further aspect of the invention, the comparison means comprises a first zero crossing detector for determining the higher of two binary bits, a second zero crossing detector for determining the lower of two binary bits, and a third zero crossing detector having a zero input for temperature stabilization. The comparison means further comprises a first differential amplifier for producing a logical high when the higher threshold is crossed having one input coupled to the first detector and another input coupled to the third detector, and a second differential amplifier for producing a logical high when the lower threshold is crossed having one input coupled to the second detector, and the other input coupled to the third detector. The gain of the differential amplifier and use of the zero reference detectors, enhances the rise time and symmetry of the comparator output.

The use of zero crossing detectors in combination with voltage dividers formed on a substrate shared in common with the active semiconductor devices allows the thresholds to be controlled by the relatively more accurate resistive ratios rather than by gate width control of two series connected FET's. Final accuracy in setting the thresholds is obtained by the provision of two externally accessible voltage references of approximately equal value, connected via pads on the IC to the internal voltage dividers.

The decoder which utilizes monolithically integrated fabrication throughout, employing buffered FET logic on a gallium arsenide substrate, operates with accuracy in decoding three level coded data transmitted via optical communication paths at bit rates of one gigabit per second and higher.

BRIEF DESCRIPTION OF THE DRAWINGS

The novel and distinctive features of the invention are set forth in the claims. The invention itself, however, together with further objects and advantages thereof may best be understood by reference to the following description and accompanying drawing, in which:

DESCRIPTION OF THE PREFERRED EMBODIMENT

Figure 1:
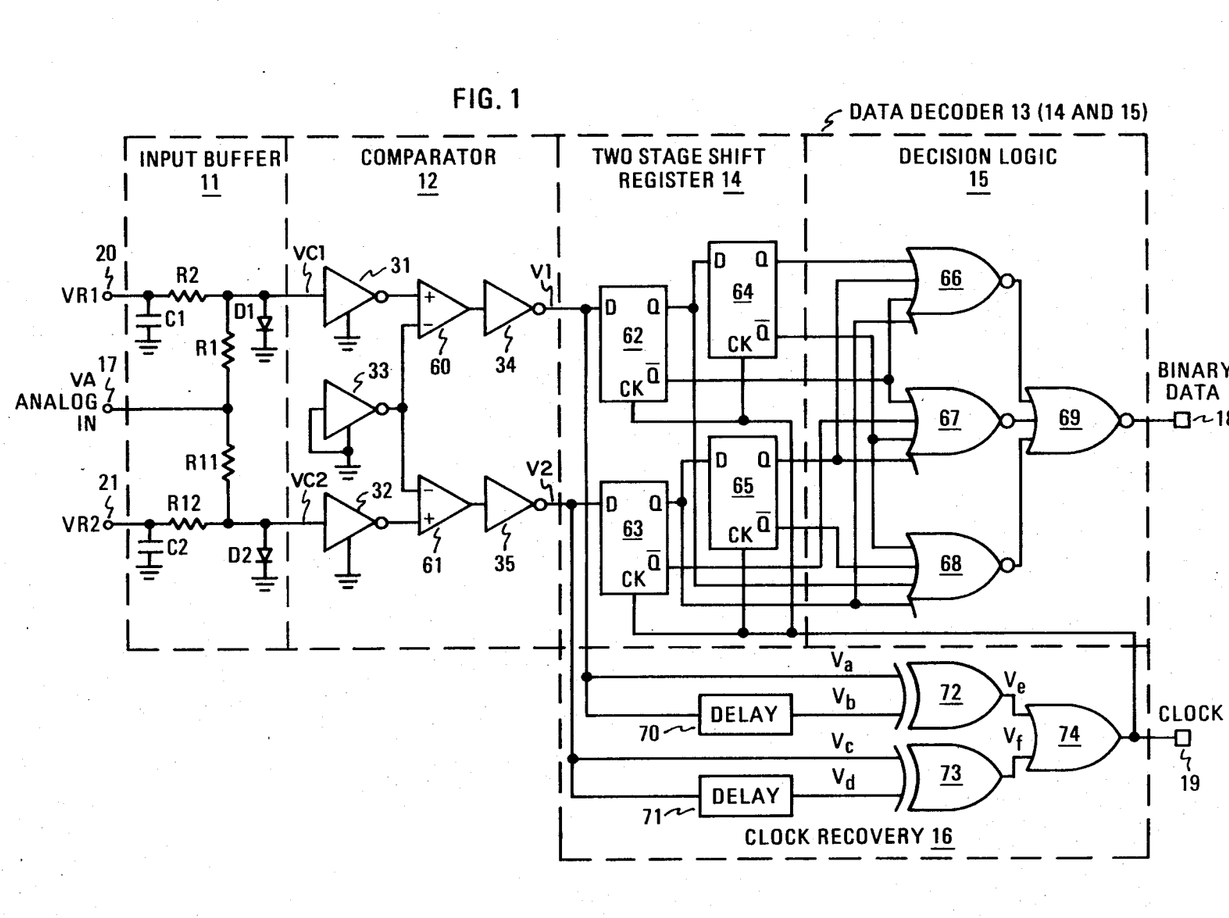
FIG. 1 is a block diagram of an electrical decoder in accordance with the invention for converting a three level coded signal to serial binary data and for recovering the clocking implicit in the signal's data stream.

Referring now to FIG. 1, novel electrical decoding apparatus for recovering the binary data and the clocking from a three level coded (TLC) data stream is shown. The decoding apparatus employs buffered FET logic, monolithically integrated upon a common substrate, preferably of gallium arsenide. The apparatus is designed to operate at a speed in excess of a one-half gHz bit rate.

In the embodiment illustrated in FIG. 1, the decoding apparatus may be seen to consist of an input buffer 11 to which the TLC data stream is applied via the input terminal 17, a comparator 12 which determines the value in two binary bits of each state of the TLC data stream, data decoder 13 and clock recovery 16. The data decoder 13 is further divided into a two stage, two bit per stage, shift register 14 and four gate decision logic 15. The decoded binary data appears at the output terminal 18 of the data decoder 13 and the recovered clocking appears at the output terminal 19 of the clock recovery 16.

The decoder of FIG. 1 may be a portion of a larger monolithically integrated circuit such as is described in U.S. application Ser. No. 688,375 of Messrs Fitelson, Wanuga and Williams and entitled MONOLITHICALLY INTEGRATED ELECTRO-OPTICAL MULTIPLEXER/DEMULTIPLEXER, or it may be a self contained monolithically integrated unit. In the later case, additional measures may be required to appropriately buffer the integrated circuit to other associated electronics. The input buffering herein described is generally appropriate to either application.

The input buffer 11 provides the input connections for the three level coded signal and transfers the three level coded signal to the comparator 12, meanwhile providing input protection for the comparator and the means for precisely adjusting the two thresholds in the comparator after fabrication, by the provision of two terminals 20, 21 to which externally accessible positive and negative reference voltages may be applied. The input buffer may be seen to consist of four resistors R1, R2, R11, R12, two diodes D1, D2, and two capacitors C1, C2. The buffer requires three external pads 17, 20, 21, two internal connections, and an internal ground.

The input buffer is connected as follows. The three level coded (TLC) input signal is connected via the input pad 17 to one terminal of each of two resistors R1, R11 (assuming that the input signal is generated off the decoder substrate). In the event the input signal is derived elsewhere on the substrate, the pad 17 is unnecessary and may be replaced by a conductive connection to the signal source. The other terminal of the resistor R1 is connected to one terminal of resistor R2, the other terminal of R2 being connected to the pad 20 for connection to a positive voltage reference VR1. The other terminal of resistor R11 is connected to one terminal of resistor R12, the other terminal of R12 being connected to the pad 21 for connection to a negative voltage reference VR2. The buffered TLC signal is coupled via the interconnection of resistor R1 and R2 to one (31) comparator input and via the interconnection of resistors R11 and R12 to a second (32) comparator input.

The signal bypass capacitors C1 and C2 are connected respectively to the pads 20 and 21 to prevent the signal from entering the external voltage reference circuitry. The diodes D1 and D2, which are connected respectively to the comparator inputs, are designed to protect the subsequent comparator circuitry from excessive signal voltages. The resistor pairs R1, R2 and R11, R12 form voltage division circuitry which in cooperation with the externally accessible positive and negative voltage references (VR1, VR2) establish the two thresholds of the comparator at values suitable for evaluating the three level coded signal.

The buffer parameters are established upon the assumption that the following comparator should employ a pair of zero crossing detectors at its input. This assumption is based upon the premise that the thresholds cannot be so accurately controlled by adjusting the geometary of series connected FET devices using non-zero detectors as using zero crossing detectors in association with integrated voltage dividers. In general, the ratioing of the voltage dividers particularly in gallium arsenide may be more accurately rendered than ratioing individual gate widths.

Assuming that the input voltages (VC1, VC2) at the zero crossing detectors equal or exceed zero to produce an output (a logical one), the buffer is designed to transform the TLC input signal (VA) at pad 17 indicative of the upper threshold to zero volts at one comparator input (VC1=0). Consistently, the buffer is designed to transform a TLC input signal (VA) indicative of the lower threshold to zero volts at the other comparator input (VC2=0). Thus, as a result of properly set thresholds, both zero crossing detectors will be low if the TLC input signal (VA) is below the lower threshold; one (VC1) zero crossing detector will be low and the other (VC2) high if the TLC input signal is above the lower threshold but below the upper threshold; and both zero crossing detectors will be high when the TLC input signal is above the upper threshold.

These relations may be expressed by two equations $$VC1 = VR1 R1/(R1+R2) + VA R2/(R1+R2)$$

$$VC2 = VR2 R11/(R11+R12) + VA R12/(R11+R12)$$

where R1,R2,R11,R12 are the values of the respectively numbered resistances.

The equations, due to the symmetry of the relationship, $(R1=R11; R2=R12; VR1=-VR2)$ provide equal signal branching between zero crossing detectors and are suitable for design purposes.

The standard signal in the present practical embodiment for three level coding has levels at +0.4 volts, 0.0 volts, and −0.4 volts. In the context of this standard, the thresholds of the comparator are set at +0.2 volts and −0.2 volts by the parameters of the buffer components. In particular, the resistors R1 and R11 are 20 ohms each, R2 and R12 are 100 ohms each, and VR1 and VR2 are externally adjustable at approximately +1.0 volt and −1.0 volt respectively. The diodes D1 and D2 are set to prevent voltages in excess of 0.6 of a volt being applied to the comparator inputs.

The comparator 12 determines the value measured in two binary bits of each state of the TLC data stream. The comparator has a first input connection for making a +0.2 volt comparison and a pair of outputs for signaling the state of the signal in relation to these thresholds and the times at which transitions occur.

The comparator, as shown in FIG. 1, comprises a first zero crossing detector 31, a second zero crossing detector 32, a zero reference detector 33, first and second differential amplifiers 60, 61 and a pair of output inverters 34 and 35. The output from the comparator is derived from the inverters 34, 35 and is coupled to the subsequent data decoding and clock recovery circuitry (13, 16). The provision of the zero reference detector 33, in association with the zero crossing detectors 31, 32 at the differential amplifier inputs stabilizes the differential amplifier output and temperature induced error.

Figure 2:
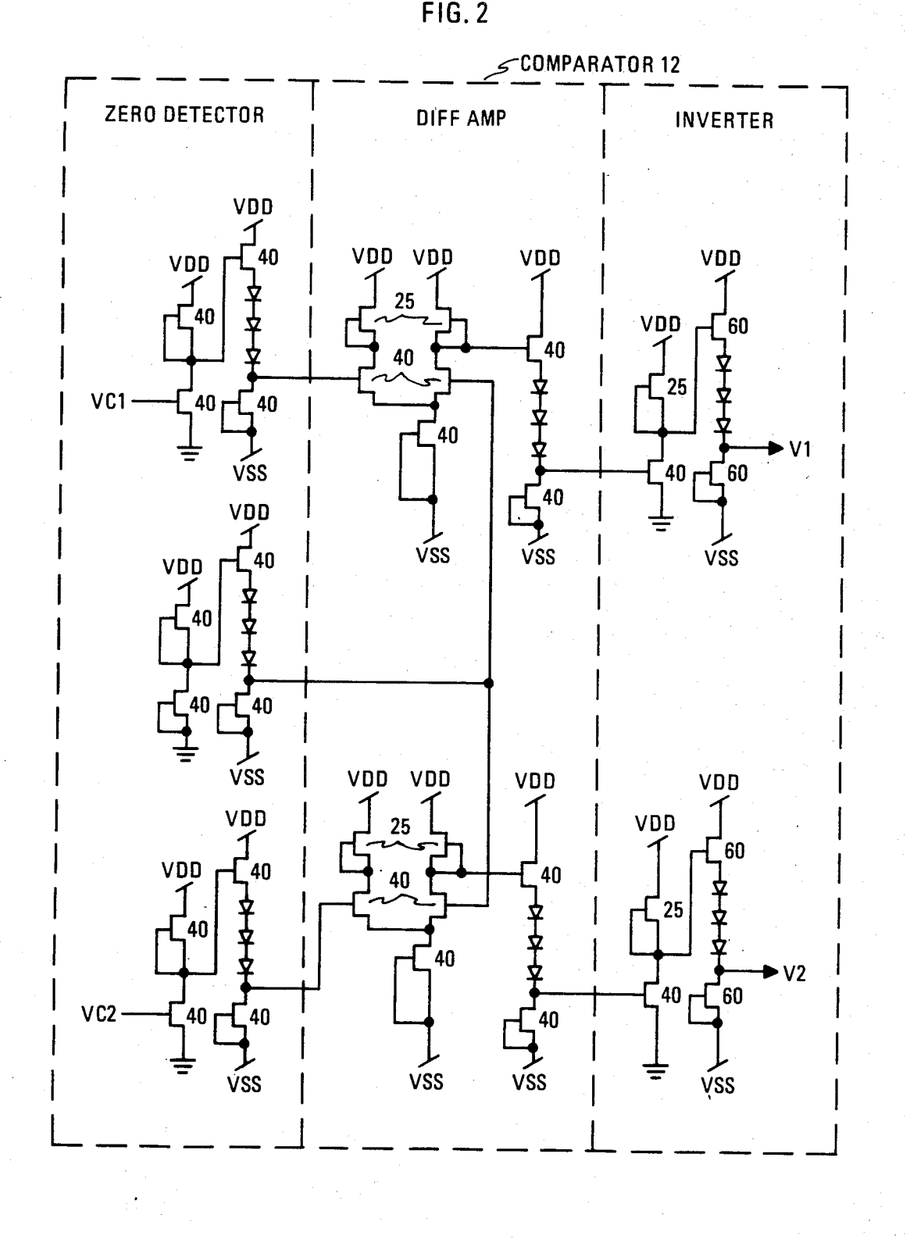
FIG. 2 is a detailed circuit diagram of a comparator forming a portion of the electrical decoder illustrated in FIG. 1.

The functional members of the electrical comparator 12 are interconnected and operate as follows. After standardization in the buffer 11, the TLC signal appears at the input of the zero crossing detector 31 (as VC1) and at the input of the zero crossing detector 32 (as VC2). The detectors 31, 32 whose circuits are illustrated in FIG. 2, are logical inverters; if the input signal is negative referenced to system ground, the inverter is in a high output state; if the input signal is equal to or in excess of zero referenced to system ground, the inverter is in a low output state. The output from the zero crossing detector 31 is connected to the positive input terminal of the differential amplifier 60 and the output from the zero crossing detector 32 is connected to the positive input terminal of the differential amplifier 61. A zero reference detector 33, which is similar in electrical design to the zero crossing detectors 31, 32 and whose input is connected to system ground, is coupled to the negative input terminal of the differential amplifier 60 and to the negative input terminal of the differential amplifier 61. Accordingly, if the output of the zero crossing detector 31 goes high in relation to the output of the zero reference detector 33 at the input of the differential amplifier 60, the output of the differential amplifier 60 goes high. Similarly, if the output of the zero crossing detector 32 goes high in relation to the output of the zero reference detector 33 at the input of the differential amplifier 61, the output of the second differential amplifier 61 goes high.

The zero reference detector 33 tends to reduce the sensitivity of the circuitry to process variations and to provide immunity to temperature induced drift, while the differential amplifier provides the necessary gain for fast switching, essential to clocking accuracy. The differential amplifier outputs are coupled respectively to the inverters 34, 35. The inverters invert the logical levels to the appropriate sign and provide the necessary power for application of the signal to the decoder 13 and the clock recovery 16.

The two binary bits appropriately expressing the value of each state of the TLC data stream now appear at the outputs of the inverters 34, 35:

| TLC | 34 state | 35 State |
| --- | --- | --- |
| 0 | 0 | 0 |
| 1 | 1 | 0 |
| 2 | 1 | 1 | where 1 is a logical high
0 is a logical low.

The comparator output is then coupled to the decoder 13 and clock recovery means 16.

The decoder 13 converts the values expressive of the states of the TLC signal, which appear at the output of the comparator 12, to conventional serial binary data. More particularly, the decoder accepts as an input the values for two successive states (e.g. values received in the (n)th and (n-1)th timing intervals) of the TLC signal, each state being expressable in two bits. The decoder converts these input values to a one bit value for the nth timing interval in a conventional serial binary format. The decoder 13 consists of a two stage, two bit per stage, shift register 14 consisting of the flip-flops 62–65 and decision logic 15 consisting of four NOR-gates 66, 67, 68 and 69.

The flip-flops 62–65 of the shift register are D-type negative edge triggered, and are clocked using the negative edge of the clocking signal. They are connected and operate as follows. The output of the inverter 34 is connected to the D input of the flip-flop 62 and the output of the inverter 35 is connected to the D input of the flip-flop 63. The inputs coupled to the D inputs of the flip-flops 62, 63 are clocked to their respective Q, $\overline{Q}$ outputs by clocking recovered from the bit stream by the clock recovery block 16. The Q output of the flip-flop 62 is coupled to the D input of the flip-flop 64, and the Q output of the flip-flop 63 is coupled to the D input of the flip-flop 65. Upon the next clock pulse, the two bits descriptive of the TLC data for the (n-1)th timing interval, are clocked to the Q, $\overline{Q}$ outputs of the flip-flops 64, 65 respectively. At the same time the two bits descriptive of the TLC data for the n(th) timing interval are clocked to the Q, $\overline{Q}$ outputs of the flip-flops 62, 63.

The process continues with each pair of flip-flops (62, 63; 64, 65) acting as a stage of a two stage shift register. The process makes data, obtained from the TLC Signal and required for the conversion, available for two successive timing intervals at the Q, $\overline{Q}$ outputs of the four flip-flops. The data at the four outputs of the flip-flops is stored for a portion of each timing interval, and then fresh data, after application to the D input is shifted in synchronism with the recovered clocking to the Q, $\overline{Q}$ flip-flop outputs. Thus the stored data in the flip-flops 62–65 is accessible for conversion by the decision logic 66–69 to serial binary data.

The decision logic, 66–69 converts the four stored bits (two for data received during the (n-1)th timing interval and two for data received during the (n)th timing interval) obtained from the shift register 62–65 to a one bit signal for the nth timing interval. Since the decoding process is continuous, a new bit is produced for each timing interval and the result is a conventional serial binary data stream, clocked at the rate of the recovered clocking.

Figure 3:
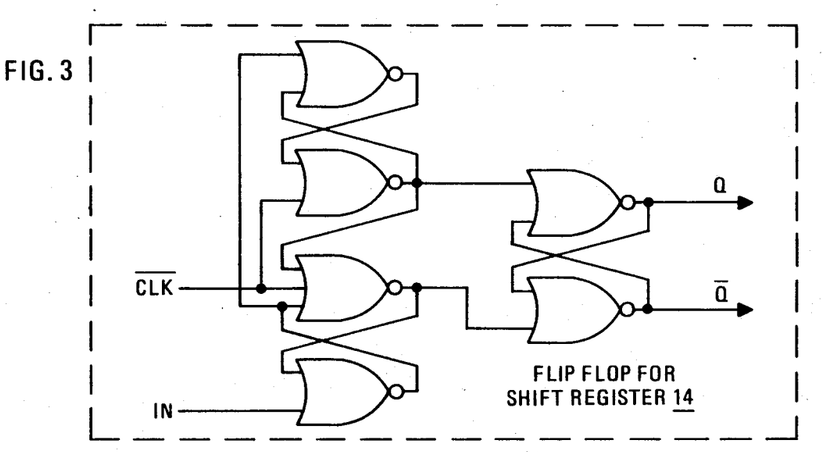
FIG. 3 is a logic diagram showing the realization of a flip-flop used in a two stage shift register forming a portion of the decoder.

The flip-flops 62–65 may be implemented using the NOR-gate structure shown in FIG. 3. The width of the FET's used in the gates of the flip-flops may be quite small, typically 20-30 microns (and smaller than those used in the clock recovery block 16). The flip-flops can use smaller FET's because the speed requirement for the flip-flops are somewhat less than other components in the circuit. The use of smaller FET's has the advantage of reducing power consumption in the IC.

The decision logic is connected and operates as follows. The three four input NOR-gates 66, 67 and 68 of the decision logic have their inputs connected to the Q, $\overline{Q}$ outputs of the flip-flops 62-65. The $\overline{Q}$ output of the flip-flop 62 (partially expressive of the data value received at the nth timing interval is coupled to an input of the NOR-gates 66, 67. The Q output of the flip-flop 62 is coupled to an input of the NOR-gate 68. The Q output of the flip-flop 63 (partially expressive of the data value received at the nth timing interval) is coupled to an input of the NOR-gates 66, 68. The $\overline{Q}$ output of the flip-flop 63 is coupled to an input of NOR-gate 67. The $\overline{Q}$ output of the flip-flop 64 (partially expressive of the data value received at the (n-1)th timing interval) is coupled to an input of the NOR-gates 67, 68. The Q output of the flip-flop 64 is coupled to an input of the NOR-gate 66. The Q output of the flip-flop 65 (partially expressive of the data received at the (n-1)th timing interval) is coupled to an input of the NOR-gates 66, 67 and the $\overline{Q}$ output of the flip-flop 65 is coupled to an input of the NOR-gates 68.

The three outputs of the NOR-gates 66, 67, 68 which are thus expressive of the data values received at the nth and (n-1)th timing intervals are coupled to the three inputs of the three input NOR-gate 69. A conventional serial binary data stream appears at this output and is coupled to output terminal 18. The truth table expressive of the operation of the decision logic 15 may be represented as follows.

| Two Bit Representation at Time: | | | | |
|---|---|---|---|---|
| (n-1)th | | (n) | | Binary Value at Time: |
| Q65 | Q64 | Q63 | Q62 | (n) |
| ∅ | ∅ | ∅ | 1 | ∅ |
| ∅ | ∅ | 1 | 1 | 1 |
| ∅ | 1 | ∅ | ∅ | 1 |
| ∅ | 1 | 1 | 1 | ∅ |
| 1 | 1 | ∅ | ∅ | ∅ |
| 1 | 1 | ∅ | 1 | 1 |

(The decoding logic shown in the logic diagram of FIG. 1 is logically equivalent to and may consist of three NAND-gates and an OR-gate, as depicted in said U.S. application Ser. No. 688,375.)

Figure 4:
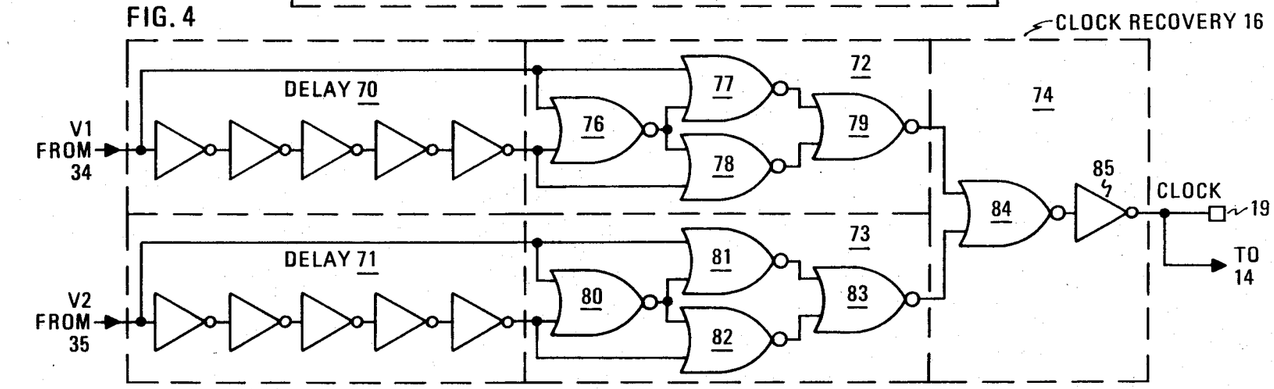
FIG. 4 is a logic diagram showing the realization of the clock recovery, forming a portion of the electrical decoder illustrated in FIG. 1.

The clock recovery 16 takes the threshold crossing information derived from the TLC input data by the comparator 12, and generates a synchronizing clock pulse for clocking out the binary data appearing at the data decoder output. The logic diagram of the clock recovery 16 is shown in FIG. 1 and is seen to consist of two delays 70-71, two exclusive OR-gates 72-73 and a final OR-gate 74. A diagram illustrating the design of the delays and exclusive OR-gates is shown in FIG. 4.

The comparator produces an output V1 at inverter 34 to indicate a crossing by the TLC signal of the upper threshold (+0.20) and an output V2 at inverter 35 to indicate a crossing by the TLC signal of the lower threshold (−0.20). The output of inverter 34 is coupled without delay to one input of exclusive OR-gate 72 and through delay 70 to the other input of gate 72. The output of the inverter 35 is coupled without delay to one input of exclusive OR-gate 73 and through delay 71 to the other input of 73. The outputs of exclusive OR-gates 72 and 73 are coupled to the two inputs or OR-gate 74. The timing pulses produced by clock recovery 16, ideally reflecting each transition of the data stream appear at the output of OR-gate 74. From this point they are coupled to a clocking terminal 19 and to the clocking inputs of the flip-flops 62-65 on the data decoder to control the clocking of the thresholded data as it proceeds to the input of the shift register 14. The decision logic 15 which operates on the data as it is clocked out of the register produces binary output data at terminal 18 in synchronism with the clock.

The clock recovery takes place in the following manner. Let us assume that the circuit is in a steady state and that the voltage V1 from 34 and V2 from 35 are stable. A steady state implies that $$V1 = Va = Vb$$

where Va, Vb are the undelayed and delayed inputs respectively of the exclusive OR-gate 72. Also in the steady state $$V2 = Vc = Vd$$

where Vc, Vd are the undelayed and delayed inputs respectively of the exclusive OR-gate 73. Noting that in the truth table for an exclusive OR-gate, like inputs e.g. (0,0: 1,1) produce a low output, the outputs of the exclusive OR-gates (72, 73) Ve, Vf respectively are zero in the steady state. Thus the output of OR-gate 74 is also zero in the steady state and the clock output (coupled to terminal 19 and to the clocking input of the two stage shift register) is also zero.

If the output at V1 changes state, then Va will change instantly and will differ from Vb until equalized by passage through the delay 70. In consequence, the logical output of exclusive OR-gate 72 (Ve) will change to a one. At the output of OR-gate 74, the clock pulse changes to a logical one (i.e. the clock pulse is on). After a period equal to the delay in 70, Va and Vb will equalize. Upon equalization Ve will return to zero and the clock pulse will return to a logical zero state (i.e. off). The foregoing is a description of a single level transition in the three level code, and describes the crossing of either the upper or lower transition. Both time delays (Td) are set equal to insure similarity in operation.

Operation for a two level transition may be similarly explained. One must assume that both V1 and V2 change within a time difference less than the time delay (Td). When that occurs, a single clock pulse will be generated. More particularly, assuming that the V1 change slightly precedes the V2 change, exclusive OR-gate 72 will show a logical one to initiate the clock pulse at 74. Similarly, assuming that the V2 change next occurs, exclusive OR-gate 73 will also produce a second logical one. The first logical one, due to the V1 change initiates a logical one (the clock pulse) at the output of OR-gate 74, and the appearance of the second logical high at the output of 73, sustains the existing logical high at 74, and sustains the clock pulse. In fact, the clock pulse at 74 caused by a double transition may be as long as two delays or as short as one delay.

In the event that the V1 change occurs first, but the appearance of the V2 change is delayed by more than Td, then two pulses may occur, indicating an improper count. More particularly, when V2 is delayed by more than Td, Ve at 72 will have returned to zero, having terminated a first clocking pulse before the logical high at 73 occurs. When the high at 73 occurs under these circumstances, the second output pulse will appear at the output of 74, resulting in an improper indication. The present circuit thus provides a clocking pulse which is of variable width, having a duration of from one to two times the duration of the Td. Improper clocking is precluded, by insuring that the rise time between thresholds in a double level transition of the waveform is less than one delay (Td).

A more detailed diagram of the clock recovery 16 is illustrated in FIG. 4. The time delay 70 consists of five inverters having the circuit configuration illustrated in FIG. 3 (e.g. inverter 34). The inverter input stage may have a 25 micron device and a 40 micron device in series with the output buffers being each 40 micron devices. The exclusive-OR function (72 or 73) is performed by the combination of four, 40 micron, two input NOR-gates as illustrated. The outputs of the two exclusive OR-gates (72, 73) are combined in a 40 micron NOR-gate followed by a 40 micron inverter. The level shifting stage or buffer of the inverter may use 80 micron devices, depending upon loading. The 80 micron design will both drive the loads indicated in FIG. 4 and those indicated in the previously cited patent application for a more extensive IC.

The logical design of the clock recovery 16 provides for accurate recovery of the clocking substantially independently of the particular transition occurring in the three level code. This may be explained from a consideration of the implementation of the clock recovery depicted in FIG. 4. Upon the occurrence of a transition sensed by the upper zero crossing detector (34), the transient propagates to the input of 16, in actuality the inputs of the NOR-gates 76, 77 (which are constituent parts of the exclusive OR-gate 72 of FIG. 1). The transition then propagates to the output of the NOR-gates 77, 79 (both parts of 72), next to the output of NOR-gate 84 and the inverter 85, (both parts of 74), and it finally appears as a logical one at the output of 16 at terminal 19. Thus, in the transition considered, there are four stages producing four propagation delays between the input and output of 16. In consequence, the clocking pulse appearing at terminal 19, commences four propagation delays after application of the transition to the input of 16.

A second issue in achieving timing accuracy independently of the TLC transition occurring, resides in the design of the individual stages. In principle, the stages 76 and 80 should have equal propagation delays, the stages 77, 78, 81 and 82 should have equal propagation delays, and the stages 79 and 83 should have equal propagation delays. In practice, all eight stages (76–83) may be identical with substantially equal propagation delays.

The duration of the clocking pulse produced by 16 is partly dependent on the transition occurring in the TLC data stream, but the starting transient remains accurate. Each transition requires five propagation delays, attributable to the five inverters of time delay 70, to reach the inputs of the first NOR-gates 76 and 78 (of exclusive OR-gate 72). The output pulse terminates after the five propagation delays represented by the time delay 70 plus the four propagation delays produced in stages 78, 79, 84, and 85 respectively. The clocking pulse, under the conditions just described, in which there are four propagation delays at the starting transient and four plus five propagation delays at the terminating transient thus has a duration of five propagation delays, attributable to the five inverters constituting the time delay 70.

The duration of the clocking pulse and the delays in the start and finish of the clocking pulse are the same for all of the single transitions in the TLC data stream. If a transition is sensed and appears at the V1 input of 16, the pulse will start four delays after the transient and terminate nine propagation delays after the transition. This is true whether it is an upward or downward transition as may be seen by counting the stages in both signal paths. The logical design of the time delay 71 and exclusive OR-gate 73 are the same as the logical design of the time delay 70 and the exclusive OR-gate 72. As a result of this sameness, the duration of the output pulse for a V1 transition is substantially the same for a V2 transition. In addition, the time delays incident to the start and termination of the output pulse attributable to a V2 transition are the same as for a V1 transition.

The clocking pulse has a longer duration when a two level rather than a single level transition occurs in the TLC data stream. Both double transitions produce pulses of substantially equal duration and both transitions start with an accurate initial transient. Assuming that the transition is first sensed at the V1 input of 16, the logical one denoting the pulse appears at the output of 16 after four propagation delays. If the TLC waveform, has the requisite short rise time, the second transition appears at the V2 input of 16 before the initial pulse has terminated and the second transition sustains the pulse already appearing at the output of 16. Thus, the possibility exists for the pulse to last for up to 10 propagation delays dependent on the rise time of the TLC waveform.

The pulse duration for the double transition in the TLC data stream is practically fixed at a value intermediate to a single and a double interval assuming that an accurate TLC waveform is provided with appropriately steep leading and trailing edges. The passage of the initial "half" (i.e. through the V1 threshold) of the transition through the delay 70 terminates the influence of the upper portion of the clock recovery circuitry (70, 72) on sustaining the output pulse, and the passage of the second "half" (i.e. through the V2 threshold) of the transition through the delay 71 terminates the influence of the lower portion of the clock recovery circuitry 71, 73 on sustaining the output pulse.

If the TLC waveform has an insufficiently steep starting transient, the possibility exists for separated pulses and incorrect decoding to occur. This possibility exists when the rise (or fall) time between the two transitions is greater than the time delay (Td). In a practical example, the propagation delays in the individual stages are 65 picoseconds producing a total time delay (Td) of 325 picoseconds. A suitable rise time for the TLC waveform for a double (or single) transition is 300 picoseconds. Under these circumstances it is assumed that the TLC waveform has a pulse to pulse period of one nanosecond and a remaining pulse duration of 700 picoseconds after the period allocated to the rise time. The rise time between thresholds in a double transition in this standard is 150 picoseconds. The resulting clocking pulses have a duration of 325 plus 150 or 475 picoseconds. Assuming symmetry in the TLC waveform, the duration of the output pulses produced by both double transitions are alike.

Consistent with the foregoing analysis, two single transitions will only be treated as two single states of the TLC data stream if they are separated by a period in excess of 475 picoseconds. The decoder accordingly has a very substantial safety margin for this kind of waveform error.

From the foregoing discussion it may be seen that while the duration of the clocking pulse is variable, the leading edge of the clocking pulse retains a high degree of accuracy irrespective of the transition in the TLC data stream involved.

FIG. 3 illustrates a logic diagram used in the flip-flops 62-65 which are used to clock the data to the binary data output 18. Accordingly, the flip-flops 62-65 are designed to be triggered on the leading edge of the clocking waveform in the correct (negative) polarity to transfer the data accummulated in the flip-flops at accurately clocked intervals to the decision logic 15.

The decoder herein described is intended to convert a three level coded data stream to binary data clocked by clocking recovered from the data stream. In a specific application of the decoder, the decoder is designed to operate as a part of a multiplexer/demultiplexer in converting information received on a wide band optical channel to a plurality of narrower band electrical channels. In the intended applications, the bandwidth of the optical channel is in excess of one-half gHz while the bandwidths of the individual electrical channels may be measured in tens of megahertz. In this application, the requisite decoder speed and accuracy is achieved by the use of the buffered FET logic herein disclosed in a monolithically integrated assembly using a gallium arsenide substrate.

What is claimed is:

1. An electrical decoder for converting a three level coded (TLC) data stream to serial binary data in which data stream each transmitted TLC bit has three possible states, transitions between all states being possible, each TLC bit representing a binary coded bit and for recovering the clocking implicit in said data stream at the transmitted bit rate, said decoder comprising:
   A. an input terminal for reception of said TLC data stream,
   B. means coupled to said input terminal for translating each of said three possible states of said TLC data stream to two bit binary values, each translation occurring at the TLC bit rate, comprising
      a first comparison means for determining the higher of said two binary bits, and
      a second comparison means for determining the lower of said two binary bits,
   C. means coupled to said means B for converting said two bit binary values to serial binary data on the basis of sensing one of the possible amplitude transitions which occur between said three possible states between adjacent clocking intervals, a single binary data bit representing each transmitted TLC bit comprising:
      1. means for storing said two bit binary values received during the (n-1)th and nth clocking intervals comprising four flip-flops, and
      2. decision logic responsive to said two bit binary values for said (n-1)th and nth clocking intervals to obtain a bit of binary data for each clocking interval, and
   D. means coupled to said means B for recovering the clocking from said TLC data stream comprising:
      1. means responsive to said means B for producing an output upon change in state of the higher of said two bits between the (n-1)th and nth clocking interval comprising,
      a first delay and a first two input exclusive OR-gate, the output of said first comparison means being applied undelayed to one of said first exclusive OR-gate inputs and applied via said first delay to the other of said first exclusive OR-gate inputs;
      2. means responsive to said means B for producing an output upon a change in state of the lower of said two bits between the (n-1)th and the nth clocking interval comprising,
      a second delay and a second two input exclusive OR-gate, the output of said second comprising means being applied undelayed to one of said second exculsive OR-gate inputs and applied via said second delay to the other of said second exclusive OR-gate inputs, and
      3. means responsive to the outputs of D(1) and D(2) for producing an output for each clocking interval comprising an OR-gate,
      said output being coupled to the clocking inputs of said flip-flops for clocking said serial binary data.

2. The decoder set forth in claim 1 wherein
said means B, C and D are monolithically integrated upon a common subsstrate;
said means B comprises
   a first zero crossing detector coupled to said input terminal for determining the higher of two binary bits,
   a second zero crossing detector coupled to said input terminal for determining the lower of said two binary bits, and
   a third zero crossing detector of comparable design to said first and second zero crossing detectors but having zero input for temperature stabilization,
   a first differential amplifier for producing a logical high when said higher threshold is crossed having its positive input coupled to the output of said first detector and its negative input coupled to the output of said third detector, and
   a second differential amplifier for producing a logical high when said lower threshold is crossed having its positive input coupled to the output of said second detector, and its negative input coupled to the output of said third detector, the gain of said differential amplifier and the zero reference detectors, enhancing the rise time and symmetry of the comparator output, respectively.

3. The decoder set forth in claim 2 having an addition thereto
   a terminal for connection to a first external voltage reference, a first internal voltage divider having one terminal connected to said TLC data input terminal, the other terminal connected to said voltage reference terminal and the tap thereof connected to the input of said first zero crossing detector for converting a signal at said first threshold input voltage to zero at the input of said first detector, and
   a terminal for connection to a first external voltage reference, a first internal voltage divider having one terminal connected to said TLC data input terminal, the other terminal connected to said voltage reference terminal and the tap thereof connected to the input of said first zero crossing detector for converting a signal at said second threshold input voltage to zero at the input of said second detector, whereby the accuracy of said internal thresholds are primarily dependent upon the accuracy of said voltage divider.

4. The decoder set forth in claim 1 wherein
said means B, C, and D are monolithically integrated upon a common substrate;
said means D(1) and D(2) each comprise like exclusive OR-gates and like time delays, each exclusive OR-gate being constituted of four NOR-gates with known propagation delays; the undelayed input being coupled to a first input of a first NOR-gate and of a second NOR-gate; the delayed input being coupled to the other input of said first NOR-gate and a first input of a third NOR-gate, the output of said first NOR-gate being coupled to the other inputs of said second and third NOR-gates, and the outputs of said second and third NOR-gates being coupled to separate inputs of the fourth NOR-gate, whereby a transition coupled to either means D(1) or means D(2) or to both means D(1) and means D(2) produces an output clocking pulse whose starting transient is initiated a like number of propagation delays after application to said means D.

5. The decoder set forth in claim 4 wherein
the accumulated propagation delay within said clock recovery means accorded to said TLC signal includes the sum of individual propagation delays for two consecutive NOR-gates and said OR-gate, and wherein
said individual propagation delays are matched to equalize the accumulated propagation delay accorded said starting transient in respect to all transitions of said TLC data stream.

6. The decoder set forth in claim 4 wherein
the flip-flops of said means C(1) are polarity selective, edge triggered flip-flops arranged to clock the data stored therein by the starting transient of said output clocking pulse for clocking accuracy.

7. A decoder set forth in claim 6 wherein
said time delays exceed the rise time between thresholds of said TLC data stream to distinguish between a monotonic sequence of two one level transitions in two clocking intervals and a two level transition in a single clocking interval for error free decoding.

8. The decoder set forth in claim 7 wherein
said means B, C and D are executed in buffered FET logic and wherein
said decoder is designed for operation with TLC data streams having a serial bit rate in excess of one half gHz.

9. The decoder set forth in claim 7 wherein
said common substrate is of gallium arsenide.

10. The decoder set forth in claim 3 wherein
said thresholds are set symmetrically above and below zero,
whereby said internal voltage dividers may be equal and said external voltage references substantially equal at optimum adjustment.

11. The decoder set forth in claim 3 wherein
said decoder is designed for operation with TLC data streams having a serially bit rate in excess of one half gHz and wherein
said logic means B, C and D are executed in buffered FET logic.

12. The decoder set forth in claim 11 wherein said common substrate is of gallium arsenide.

* * * * *